United States Patent [19]

Kapetanakos et al.

[11] 4,150,340

[45] Apr. 17, 1979

[54] HIGH-POWER MICROWAVES FROM A NON-ISOCHRONOUS REFLECTING ELECTRON SYSTEM (NIRES)

[75] Inventors: Christos A. Kapetanakos, Bethesda; Phillip A. Sprangle, Silver Spring; Redge A. Mahaffey, Wheaton; Jeffry Golden, Laurel, all of Md.

[73] Assignee: The United States of America as represented by the Secretary of the Navy, Washington, D.C.

[21] Appl. No.: 889,797

[22] Filed: Mar. 22, 1978

[51] Int. Cl.[2] .......................... H01J 25/74; H03B 9/01

[52] U.S. Cl. .......................................... 331/81; 315/3; 328/227; 331/104

[58] Field of Search ........................ 331/79, 81, 84, 92, 331/93, 104; 315/3, 4, 5, 5.18, 5.19, 5.21, 5.24, 5.38; 328/220, 227

[56] References Cited

U.S. PATENT DOCUMENTS

| | | | |
|---|---|---|---|
| 1,962,195 | 6/1934 | Hollmann | 331/93 |
| 2,635,206 | 4/1953 | Pierce | 315/5.12 |
| 3,489,943 | 1/1970 | Denholm | 315/5 |
| 3,789,257 | 1/1974 | Friedman et al. | 315/3 |
| 3,885,193 | 5/1975 | Budker et al. | 315/5.25 |
| 4,038,602 | 7/1977 | Friedman | 315/5 X |

*Primary Examiner*—Siegfried H. Grimm
*Attorney, Agent, or Firm*—R. S. Sciascia; Philip Schneider

[57] ABSTRACT

A reflecting electron tube for producing high-power, high-frequency, monochromatic microwave pulses includes an anode which produces little or no ion flux when struck by electrons emitted from a cathode, and requires no applied, external magnetic field. An anode support holding the anode and a cathode shank which supports the cathode are positioned within a vacuum chamber such that the anode is closely spaced from the cathode. The anode support is connected to a pulsed high-voltage supply located external to the chamber. The anode is formed from a material which does not produce a significant amount of ion flux but does permit electrons emitted from the cathode to oscillate through the anode. Electrons oscillating in phase bunch together within the potential well of the system and emit microwave radiation.

5 Claims, 9 Drawing Figures

HIGH-POWER MICROWAVES FROM A NON-ISOCHRONOUS REFLECTING ELECTRON SYSTEM (NIRES)

BACKGROUND OF THE INVENTION

This invention relates generally to the generation of electro-magnetic radiation and more particularly to a reflecting electron system which produces coherent high-power, high-frequency, monochromatic micro-wave pulses from oscillating electrons that are moving at relativistic speeds.

Existing devices that generate microwaves through the use of relativistic electrons are not reflecting electron systems but rather feature an electron beam propagating through a waveguide for some distance and at least one of the following: the application of an external magnetic field parallel to the drifting electron beam; the use of resonant cavities along the waveguide; or the presence of a modulator within the waveguide, such a modulator being either a perturbed magnetic field or corrugated walls of the waveguide. Further limitations of existing microwave generators include their large sizes, which are at least a meter in length, and the fact that in most configurations their emitted microwave pulses are of significantly shorter duration than that of the applied potential to the system. These limitations confine the applications of the existing devices and thereby affect their usefulness.

Recently, reflecting electron systems employing a low-inductance, coaxial reflex triode have been used successfully to produce megavolt proton pulses of peak current in excess of 200 kiloamperes by the creation of an abundant ion flux. The present invention demonstrates that, under suitable conditions, reflecting electron systems can also generate high-power microwaves without the limitations of, but with distinct advantages over, existing microwave generators.

SUMMARY OF THE INVENTION

It is the general purpose and object of the present invention to efficiently convert the energy of oscillating relativistic electrons into high-power, high-frequency microwave radiation. Another object is to provide a reliable microwave generator which can be easily and inexpensively manufactured. These and other objects of the present invention are accomplished by a reflecting electron system with its anode suitably selected to produce little or no ion flux when struck by electrons, and to which system no external magnetic field is applied. The system includes a cathode closely spaced from the anode, both of which are enclosed in a chamber in which a vacuum is maintained.

When a positive pulse voltage is applied to the anode, electrons are emitted from the cathode. The electrons are accelerated to relativistic speeds by the positive pulse applied to the anode, pass through the anode and form a virtual cathode. Generally, the virtual cathode is formed at a distance from the anode that is different from the spacing between the anode and real cathode. As a result of the positive applied potential on the anode, the electrons do not leave the system but rather oscillate asymmetrically between the real and virtual cathodes.

The microwave emission is attributed to the electrons oscillating in phase and bunching together within the potential well of the system. This bunching occurs in the presence of an oscillatory electric field the strength of which field is approximately uniform across the surface of the anode as a function of time because of the dependence of the electron oscillation frequency on the electron energy.

The advantages of the present device over existing relativistic electron beam microwave generators are: no applied magnetic field or waveguide is required to generate microwave radiation; it is compact because microwaves are generated within a space of only approximately five centimeters in the axial direction or about five percent of the space required for existing devices; it is tunable, monochromatic, and capable of producing a microwave pulse almost as long as the duration of the applied potential on the anode. Therefore, rather than utilize a long electron beam that travels in one direction and either apply a perturbed external magnetic field or use a slow-wave structure as existing microwave generators do, the present invention forms electrons that oscillate within the system, thereby creating microwave radiation for as long as the positive pulse is applied to the anode.

As compared to existing reflex triodes, which are used to produce ion beams, the present invention has two novel features: first, the anode is formed from a material which produces very little ion flux when struck by electrons, and thus the space charge neutralization is kept to a minimum; and second, no applied external magnetic field is required.

Other objects and advantages of the invention will become apparent from the following detailed description of the invention when considered in conjunction with the accompanying drawings wherein:

DETAILED DESCRIPTION OF THE INVENTION

Figure 1:
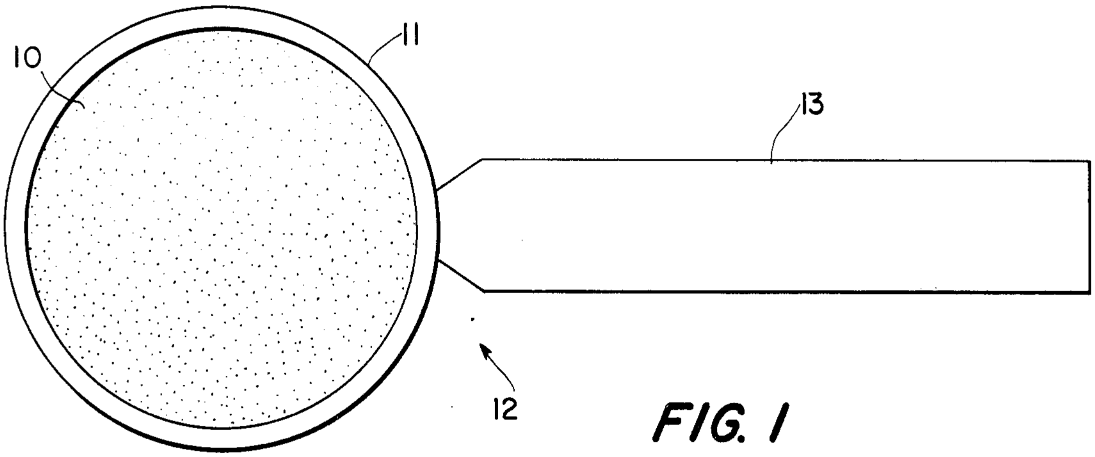
FIG. 1 is a side view of the anode secured by the anode support.
Figure 2:
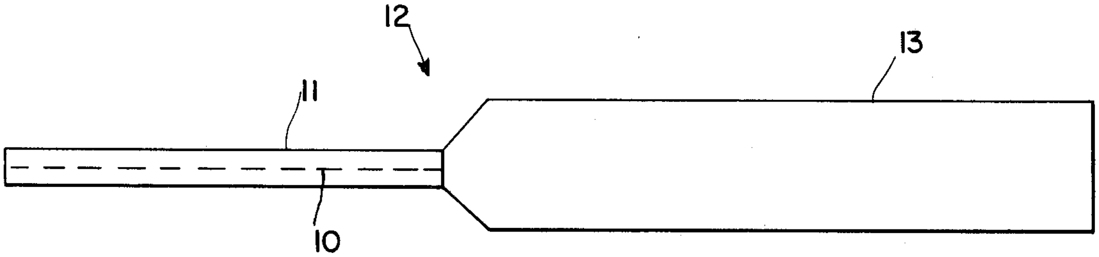
FIG. 2 is a top view of the anode and anode support shown in FIG. 1.

Referring now to the drawings, wherein like reference characters designate like or corresponding parts throughout the several views, FIGS. 1 and 2 show an anode 10 made of a material, such as a thin film of aluminized MYLAR approximately 6 micrometers thick, which produces an insignificant amount of ion flux when struck by electrons, and across the surface of which the strength of an electric field is approximately uniform as a function of time. Holding the anode 10 is a typical support 12, made of a conducting material such as aluminum, one end of which is a circular ring 11 with a convenient diameter of approximately 12 centimeters, within the space of which ring the anode is suitably placed and secured, for example with glue. The remaining portion of the anode support 12 is a stalk 13 of the shortest convenient length.

Figure 3:
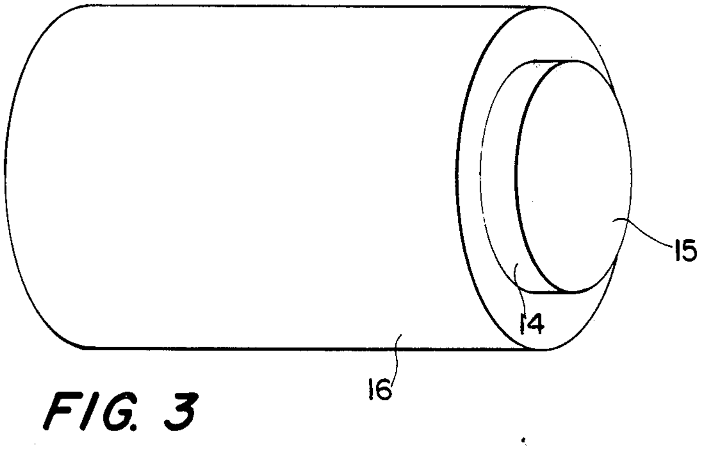
FIG. 3 is an isometric view of the cathode supported by the cathode shank.

The cathode 14 as shown in FIG. 3 is made of an electron-emitting material such as carbon and may be of any suitable shape but is preferably cylindrical with a flat circular surface 15 which emits a solid beam of electrons. The electron-emitting surface 15 of the cathode 14 is typically smaller than the circular surface of the anode 10 and is approximately 8 centimeters in diameter. The cathode 14 is fastened to a suitable cathode shank 16 made of any suitable conducting material, such as stainless steel.

Figure 4:
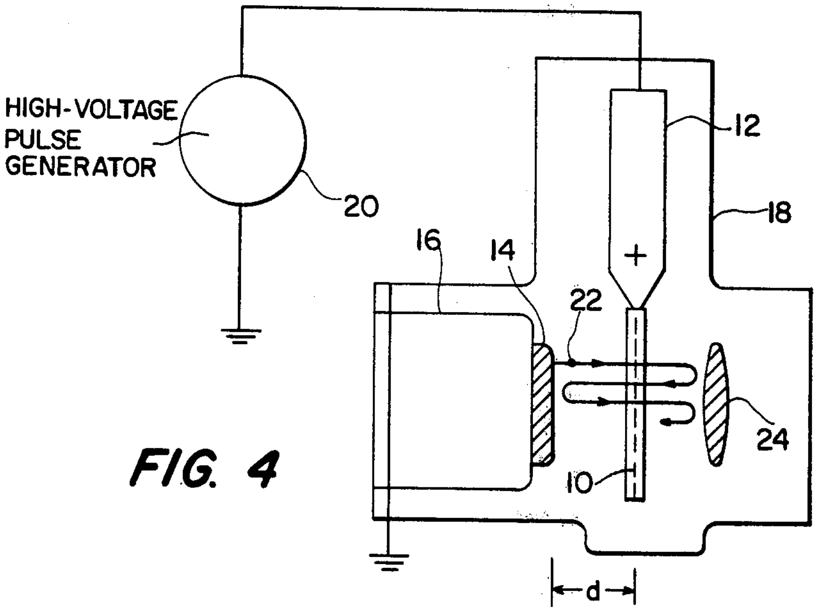
FIG. 4 is a schematic illustration of an embodiment of the present invention.

FIG. 4 portrays an embodiment of the reflecting electron system enclosed within a grounded chamber 18 in which a vacuum below $10^{-4}$ torr is maintained. The chamber 18 is of a size which will conveniently hold the anode support 12, cathode 14 and cathode shank 16, and is fabricated from any material, such as stainless steel, which will hold a vacuum. The positive terminal of a high-voltage generator 20 suitably passes through a wall of the chamber 18 and connects to the stalk of the anode support 12 for providing a low-inductance structure. The anode support 12 is spaced far enough away from the wall of the chamber 18 to avoid arcing (typically about 3 centimeters away). The cathode shank 16, securing the cathode 14, is situated within the chamber 18 such that the shank touches the chamber wall thereby grounding both the shank and the cathode, and such that the emitting surface of the cathode is parallel to, and is a distance, which may vary as explained more fully hereinafter, of approximately 1 centimeter from the flat circular surface of the anode 10.

The high-voltage supply or generator 20 used in the present invention is a 7-ohm line which produces a 250–350 kilovolt positive pulse for a 50 nanosecond duration. The power of emitted microwave radiation with this generator is approximately 100 megawatts in the X-band frequency. However, as will become apparent hereinafter, a higher voltage will increase the frequency and power of the microwave radiation, and a longer duration of the applied voltage pulse will increase the duration of the microwave radiation and thus its total energy. Therefore, any high-voltage generator, which is capable of producing a large positive voltage pulse within the range of hundreds of kilovolts to megavolts, may be utilized with the present invention. The duration of the pulse may be as long as the time over which the impedance of the system does not change significantly. Although the present invention utilizes an aluminized mylar anode 10, any anode which produces a very low ion flux, or none, and can withstand the desired higher voltages and longer pulse durations is suitable.

In operation, as shown in FIG. 4, a 50-nanosecond duration, 250–350 kilovolt positive pulse from the generator 20 is applied to the aluminized MYLAR anode 10. Electrons 22 emitted from the grounded cathode 14 are accelerated by the positive pulse that is applied to the anode 10, pass through the anode and form a virtual cathode 24. In general, the virtual cathode 24 is formed at a distance from the anode 10 that is less than the spacing (d) between the anode and real cathode 14 and which distance is a function of the amplitude of the current emanating from the real cathode. As a result of the positive potential on the anode 10, the electrons 22 do not leave the system but rather oscillate between the real 14 and virtual 24 cathodes.

Figure 5:
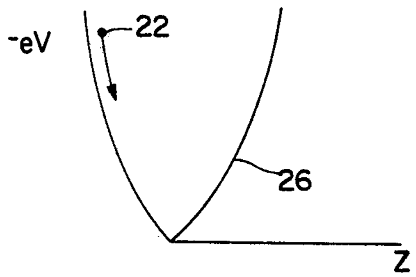
FIG. 5 is a schematic illustration of an idealized potential well of the embodiment shown in FIG. 4.
Figure 6:
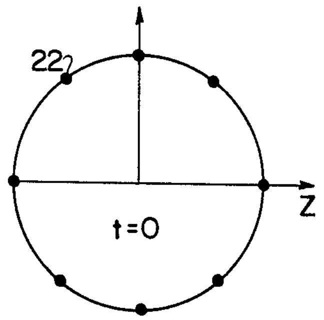
FIG. 6 illustrates the spacing of electrons within an idealized potential well.
Figure 7:
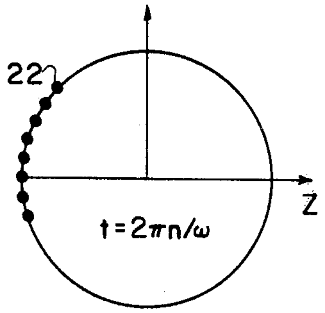
FIG. 7 illustrates the bunching of electrons in the presence of an oscillatory electric field within a potential well.

The microwave emission is attributed to the phase-bunching of the oscillating electrons 22 inside the potential well 26, shown in FIG. 5, of the system. This bunching occurs in the presence of an oscillatory electric field the strength of which field is approximately uniform across the surface of the anode as a function of time because of the dependence of the electron oscillation frequency $\omega_0$ on the electron energy ($\epsilon$). For the idealized parabolic potential well 26 of FIG. 5, $\omega_0$ is a function of $\epsilon$ only for relativisitic electrons. In the presence of an oscillatory electric field $E=E_0\cos(\omega t)$ of frequency $\omega \geqq \omega_0$, a sample of initially uniformly distributed electrons 22, as shown in FIG. 6, will be bunched as shown in FIG. 7. The reason for this bunching is that $\partial\omega_0/\partial\epsilon<0$, and thus those electrons located in the upper half plane at $t=0$ gain energy ($\omega_0$ decreases) and their phase slips behind the wave of the electric field, while those at the lower half plane lose energy ($\omega_0$ increases) and their phase advances ahead of the wave. Both the power and the frequency of the emitted microwaves appear to be sensitive to the shape of the cathode 14. The maximum power was obtained at a magnetic field $B_0=0$ with a solid carbon cathode of 8.4 centimeters outer diameter separated from the aluminized MYLAR anode 10 by a distance $d=1.2$ centimeters. The emitted microwave radiation was in both the X-band ($f=8.2-12.4$ GHz) and the Ka-band ($f=26.5-40$ GHz). The power emitted at a single frequency over a solid angle of $4\pi$ radians was between 90–100 megawatts in the X-band and more than 10 megawatts in the Ka-band corresponding to an over-all efficiency of about 1.5%.

Figure 8:
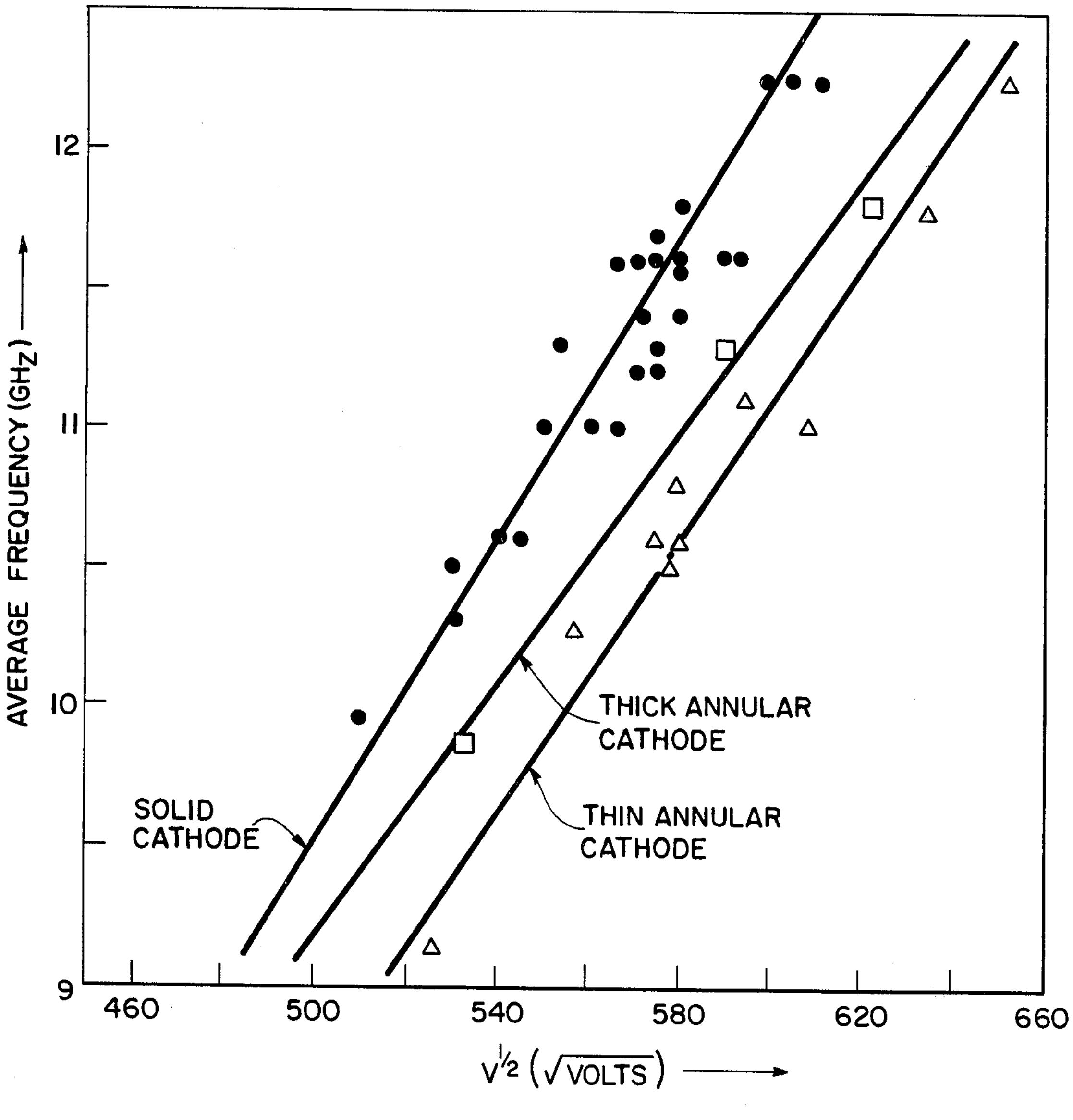
FIG. 8 is a graph illustrating the variation of the microwave frequency with an applied voltage for three different shapes of the cathode.
Figure 9:
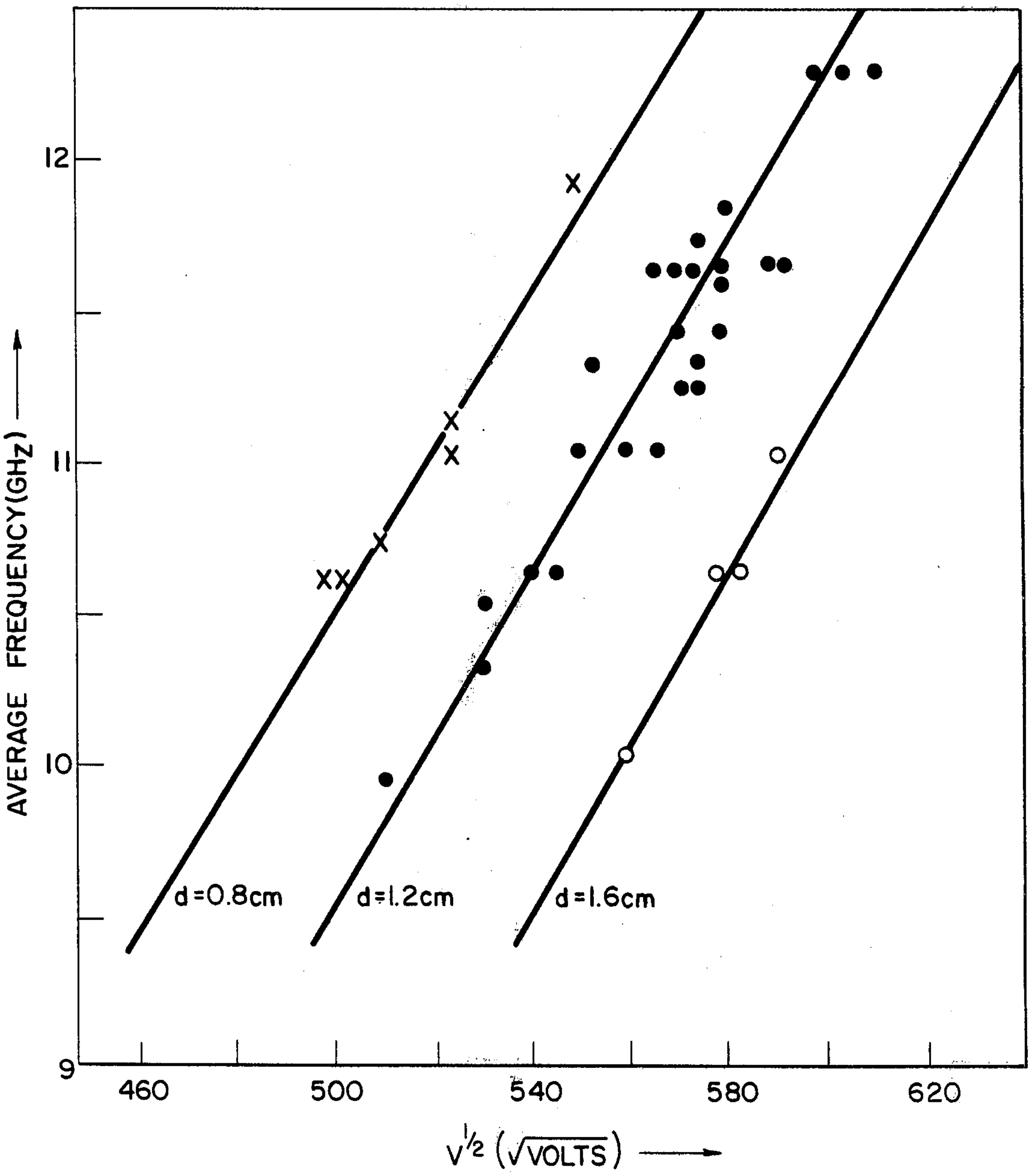
FIG. 9 is a graph illustrating the variation of the microwave frequency with the applied voltage for three different anode-real cathode space openings.

A striking feature of the device is the variation of the microwave radiation frequency (f) with applied voltage (V) shown in FIG. 8. Clearly, the central frequency $f_c$ of the spectrum varies as the function $f_c \sim (\bar{V})^{\frac{1}{2}}$, where $\bar{V}$ is the time-averaged anode potential. In addition, the results of FIG. 8 show that the frequency depends upon the shape of the cathode 14. It can be shown that the distance between the virtual cathode 24 and anode 10 decreases as the thickness of an annular cathode 14 increases. Since the frequency of radiation $f \approx l\tau_t^{-1}$, where l is an integer and $\tau_t$ is the transit time of a typical electron 22 in the potential well 26, higher frequencies are expected with higher voltages and shorter distances between the real 14 and virtual 24 cathodes. As the anode 10 is moved closer to the real cathode 14, the spacing between the anode and the virtual cathode 24 is also reduced and thus higher frequencies are expected (see FIG. 9).

A drastic reduction in the X-band microwave power is observed when the system is immersed in an external magnetic field $B_0$. The emitted power shows a resonance-like behavior with the applied field. The power at the peak of the resonance is about two orders of magnitude lower than the corresponding power at $B_0=0$. In addition, the frequency of the emitted radiation increases approximately linearly with the value of applied magnetic field.

To determine the generation of the microwave radiation, consider the dynamics of an ensemble of collisionless electrons 22 that initially are distributed uniformly in phase inside an arbitrary potential well 26 described by the electric field $E^{(0)}(z)$. It is assumed that at $t=t_0$ the system is perturbed by a small-amplitude, homogenous electric field $E^{(1)}=\hat{E}\exp(i\omega t)$. The equilibrium orbit of an electron ($E^{(1)}=0$) is written in the form $$Z^{(o)}(t) = \sum_{l=-\infty}^{\infty} \hat{Z}^{l}(\epsilon)\exp\{il[\omega_o(\epsilon)t + \psi_o]\},$$

where $\hat{z}_l$ is the lth Fourier amplitude, $\omega_0$ is the fundamental oscillation frequency and $\psi_0$ is the initial phase of the particle. $\omega_0$ and $\hat{z}_l$ are, in general, functions of the total equilibrium energy $\epsilon=(\gamma^{(0)}-1)m_0c^2-|e|\phi^{(0)}=-\partial\phi^{(0)}/\partial z^{(0)}$. The change of the system's kinetic energy density due to $E^{(1)}$, averaged over $\psi_0$ for the $l=1$ mode, is $$\Delta W_{K.E} = W_{K.E}(t) - W_{K.E}(t_o) = \tag{1}$$

$$\frac{|e|^2 n_o\hat{E}^2\omega_o}{2(\Delta\omega_1)^2}\left[\omega_o\frac{\partial|\hat{Z}_1|^2}{\partial\epsilon}(1-\cos\Delta\omega_1\tau) + |\hat{Z}_1|^2\frac{\partial\omega_o}{\delta\epsilon}\left\{\left(1+\frac{2\omega_o}{\Delta\omega_1}\right)(1-\cos\Delta\omega_1\tau)-\omega_o\tau\sin\Delta\omega_1\tau\right\}\right],$$

where $n_0$ is the average electron density, $\Delta\omega_l=\omega-l\omega_0$, and $\tau=t-t_0$.

If $\Delta W_{K.E}>0$, the perturbing wave is absorbed by the oscillating electrons 22 while, if $\Delta W_{k.E}<0$, the electrons lose kinetic energy to the wave resulting in wave growth. The term on the right hand side of Eq. (1) which contains the quantity $\partial|\hat{z}_1|^2/\partial\epsilon$ is always positive and hence is a stabilizing term. The remaining term which is proportional to $\partial\omega_0/\partial\epsilon$, however, can be negative depending on the sign of $\partial\omega_0/\partial\epsilon$ and $\Delta\omega_1$. It is this term which gives rise to the growth of the wave. It can be shown from Eq. (1) that the condition for the initial growth of the wave is that $$(\Delta\omega_1)^{-1}\partial\omega_0/\partial\epsilon<0, \tag{2a}$$

together with $$\frac{\partial|Z_1|^2}{\epsilon} < -\frac{|Z_1|^2}{\Delta\omega_1}\frac{\partial\omega_o}{\partial\epsilon}. \tag{2b}$$

The electron oscillations are non-isochronous, $\partial\omega_0/\partial\epsilon\neq0$, if the potential well 26 is non-parabolic and/or the electrons 22 are relativistic. Both of these situations are satisfied. Using the wave equation for $E^{(1)}$ an approximate dispersion relation has been derived, which in the vicinity of the unstable frequency takes the form $$(\Delta\omega_1)^3-\omega_b^2\omega_0M_0(\partial/\partial\epsilon)(\omega_0|\hat{Z}_1|^2)\Delta\omega_1/2 = (\omega_b^2\omega_0^2M_0|\hat{Z}_1|^2/2)\partial\omega_0/\partial\epsilon, \tag{3}$$

where $\omega_b^2=4\pi|e|^2n_0/m_0$.

As an illustration, consider the simplified situation where the electrons 22 are mildly relativistic and the potential well 26 is parabolic (symmetric) given by $E^{(0)}(z^{(0)})=\xi_0z^{(0)}$ where $\xi_0$ is a constant. To the lowest order in the small parameter $\epsilon/m_0c^2$, it is determined that $$\omega_o = \alpha_o\left(1-\frac{3}{8}\frac{\epsilon}{m_oc^2}\right), \tag{4}$$

and

-continued $$|Z_1|^2 = \frac{c^2}{2\alpha_o^2}\frac{\epsilon}{m_oc^2},$$

where $\alpha_0=|e|\xi_0/m_0$ is the non-relativistic electron oscillation frequency in a parabolic potential well 26. Using Eq. (4) in the expression for the dispersion relation, a threshold condition for instability exists and is $$\epsilon/m_oc^2 > \frac{8}{9\sqrt{3}}\frac{\omega_b}{\alpha_o}. \tag{5}$$

If the inequality in (5) is satisfied, Eq. (3) can be solved for the linear growth rate $\Gamma=Im(\Delta\omega_1)$ and frequency shift $\delta\omega=Re(\Delta\omega_1)$, which are:

$$\Gamma=\sqrt{3/4}(3/4)^{1/3}(\omega_b^2\alpha_0)^{1/3}(\epsilon/M_0C^2)^{2/3}=\sqrt{3}\delta\omega.$$

It is apparent from the previous discussion that the present invention has five interesting features: the emitted power is maximum when $B_0=0$; compactness; turnability; monochromaticity; and long microwave-pulse duration.

The present invention is capable of generating hundreds of magawatts of microwave radiation by refining the apparatus, such as utilizing a higher-power generator 20, as previously discussed, and by immersing the system in a resonant cavity of suitable dimensions.

Obviously many more modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A non-isochronous reflecting electron system, receiving an electrical pulse from a high-voltage pulse generator, for producing microwave radiation comprising:

a functional structure having only two real electrodes, the first electrode being a means for emitting electrons which move at relativistic speeds and the second electrode being a structure spaced from the first electrode and including a film made from a material which produces low ion flux when struck by electrons, and across the surface of which second electrode the strength of the electric field produced by said high-voltage pulse generator is approximately uniform as a function of time, said electrodes having a potential difference therebetween when pulsed by said pulse generator whereby the second electrode can be made more positive than the first so that, without the application of any other fields, said relativistic electrons emitted from the first electrode during the application of said potential difference pass through said second electrode, form a virtual cathode beyond said second electrode, return through said second electrode, and continue to oscillate through said second electrode, said virtual cathode being formed at a distance beyond the second electrode which is a function of the amplitude of current emanating from the first electrode and which is less than the distance between the first and second electrodes, the frequency of oscillation depending on the change in kinetic energy of the electrons as a function of time so that said electrons form bunches and continue to oscillate in bunches and in phase during the period of application of said potential difference to produce microwave radiation.

2. A system as recited in claim 1, wherein said first electrode is a cathode for emitting electrons by field emission.

3. A system as recited in claim 1, wherein said second electrode is an anode formed from a thin film of aluminized MYLAR.

4. A system as recited in claim 1, wherein said electrodes are enclosed by a chamber for maintaining a vacuum and providing a low-inductance structure.

5. A system as recited in claim 2, wherein said cathode is formed from carbon.

* * * * *